United States Patent
Yeh et al.

(10) Patent No.: US 11,703,900 B2
(45) Date of Patent: Jul. 18, 2023

(54) TRANSMITTER

(71) Applicant: Cvitek Co. Ltd., Beijing (CN)

(72) Inventors: Chun-Wen Yeh, Zhubei (TW);
Ching-Lung Ti, Zhubei (TW);
Chia-Chieh Tu, Hsinchu (TW)

(73) Assignee: Cvitek Co. Ltd., Beijing (CN)

( * ) Notice: Subject to any disclaimer, the term of this patent is extended or adjusted under 35 U.S.C. 154(b) by 107 days.

(21) Appl. No.: 17/543,511

(22) Filed: Dec. 6, 2021

(65) Prior Publication Data

US 2022/0190716 A1    Jun. 16, 2022

(30) Foreign Application Priority Data

Dec. 14, 2020  (CN) .......................... 202011472437.7

(51) Int. Cl.
| | |
|---|---|
| H03K 19/0185 | (2006.01) |
| G05F 1/575 | (2006.01) |
| G05F 1/565 | (2006.01) |
| H02M 3/155 | (2006.01) |

(52) U.S. Cl.
CPC .............. G05F 1/575 (2013.01); G05F 1/565 (2013.01); H03K 19/018507 (2013.01); H02M 3/155 (2013.01)

(58) Field of Classification Search
CPC . G05F 1/565; G05F 1/575; H03K 19/018507; H02M 3/155
See application file for complete search history.

(56) References Cited

U.S. PATENT DOCUMENTS

| | | | |
|---|---|---|---|
| 10,622,994 B2* | 4/2020 | Havanur | H03K 17/6872 |
| 2004/0150434 A1* | 8/2004 | Lu | H04L 25/028 |
| | | | 327/112 |
| 2009/0140778 A1* | 6/2009 | Kikuchi | H03K 19/018585 |
| | | | 327/108 |
| 2009/0160495 A1* | 6/2009 | Chen | H03K 17/063 |
| | | | 327/108 |
| 2017/0353188 A1* | 12/2017 | Saeki | G05F 1/575 |
| 2018/0102797 A1* | 4/2018 | Lim | H03K 19/0175 |

* cited by examiner

*Primary Examiner* — Jue Zhang
(74) *Attorney, Agent, or Firm* — Innovation Counsel LLP (57) ABSTRACT

A transmitter is provided. the transmitter includes a hybrid feedback circuit and a hybrid driving circuit. The hybrid feedback circuit compares a reference voltage with a feedback voltage in closed-loop, determines whether to perform polarity reversal according to a mode control signal, controls power output according to a comparison result and the mode control signal, and generates a first output signal. The hybrid driving circuit, coupled to the hybrid feedback circuit, receives the first output signal of the hybrid feedback circuit, generates a transmitter output signal according to an input data, and generates a second output signal according to the transmitter output signal. The first output signal and the second output signal are transmitted back to the hybrid feedback circuit.

8 Claims, 6 Drawing Sheets

TRANSMITTER

This application claims the benefit of People's Republic of China application Serial No. 202011472437.7, filed Dec. 14, 2020, the subject matter of which is incorporated herein by reference.

BACKGROUND OF THE INVENTION

Field of the Invention

The invention relates in general to a transmitter, and more particularly to a low-voltage transmitter with multiple output modes.

Description of the Related Art

Most currently available transmitters only support a particular output mode, such as a voltage output mode or a current output mode. The power output of the MOS transmitter is only applicable to either the PMOS transistors or the NMOS transistors.

Therefore, the transmission protocols that currently available transmitters can support are limited to some application fields.

SUMMARY OF THE INVENTION

The invention is directed to a low-voltage transmitter with multiple output modes.

According to one embodiment of the present invention, a transmitter is provided. The transmitter includes a hybrid feedback circuit and a hybrid driving circuit. The hybrid feedback circuit compares a reference voltage with a feedback voltage in closed-loop, determines whether to perform polarity reversal according to a mode control signal, controls power output according to a comparison result and the mode control signal, and generates a first output signal. The hybrid driving circuit, coupled to the hybrid feedback circuit, receives the first output signal of the hybrid feedback circuit, generates a transmitter output signal according to an input data, and generates a second output signal according to the transmitter output signal. The first output signal and the second output signal are transmitted back to the hybrid feedback circuit.

According to the said transmitter, the hybrid feedback circuit includes an error amplifier, a polarity multiplexer, a hybrid power output unit, and a feedback multiplexer. The error amplifier has a first input end, a second input end, a first output end, and a second output end. The first input end of the error amplifier is configured to receive the reference voltage. The second input end of the error amplifier is configured to receive the feedback voltage. The first output end of the error amplifier is configured to output a first error amplification output signal. The second output end of the error amplifier is configured to output a second error amplification output signal. The polarity multiplexer, coupled to the error amplifier, has a first input end, a second input end, a third input end, a fourth input end, and an output end. The first input end of the polarity multiplexer is configured to receive the first error amplification output signal from the error amplifier. The second input end of the polarity multiplexer is configured to receive the second error amplification output signal from the error amplifier. The third input end of the polarity multiplexer is configured to receive the second error amplification output signal from the error amplifier. The fourth input end of the polarity multiplexer is configured to receive the first error amplification output signal from the error amplifier. The output end of the polarity multiplexer is configured to output a polarity output signal. The hybrid power output unit, coupled to the polarity multiplexer, includes a first transistor and a second transistor, wherein one of the first transistor and the second transistor is selected to perform power output. The feedback multiplexer, coupled to the hybrid power output unit, has a first input end coupled to a feedback node for receiving the first output signal, a second input end for receiving the second output signal, and an output end for outputting the feedback voltage.

According to the said transmitter, the hybrid feedback circuit further includes a hybrid compensation unit coupled to the hybrid power output unit for compensating the hybrid power output unit.

According to the said transmitter, the hybrid driving circuit includes a hybrid driving unit and a common-mode voltage acquisition unit. The hybrid driving unit includes a current source and several transistors, wherein the transistors are selectively coupled to the ground end and selectively coupled to the current source for generating the transmitter output signal. The common-mode voltage acquisition unit is coupled to the hybrid driving unit for obtaining the second output signal from the transmitter output signal.

When the said transmitter is in a voltage output mode and the second transistor is selected to output power, the polarity multiplexer selects the first input end of the polarity multiplexer to receive the first error output signal from the error amplifier and selects the second input end of the polarity multiplexer to receive the second error amplification output signal from the error amplifier; the feedback multiplexer selects the first output signal as the feedback voltage; the transistors of the hybrid driving unit are coupled to the ground end and disconnected from the current source.

When the said transmitter is in a voltage output mode and the first transistor is selected to output power, the polarity multiplexer selects the fourth input end of the polarity multiplexer to receive the first error amplification output signal from the error amplifier, selects the third input end of the polarity multiplexer to receive the second error amplification output signal from the error amplifier, and selects the first output signal as the feedback voltage; the transistors of the hybrid driving unit are coupled to the ground end and disconnected from the current source.

When the said transmitter is in a current output mode and the second transistor is selected to output power, the polarity multiplexer selects the first input end of the polarity multiplexer to receive the first error amplification output signal from the error amplifier and selects the second input end of the polarity multiplexer to receive the second error amplification output signal from the error amplifier; the feedback multiplexer selects the second output signal obtained by the common-mode voltage acquisition unit as the feedback voltage; the transistors of the hybrid driving unit are coupled to the current source and disconnected from the ground end.

When the said transmitter is in a current output mode and selects the first transistor is selected to output power, the polarity multiplexer selects the fourth input end of the polarity multiplexer to receive the first error amplification output signal from the error amplifier and selects the third input end of the polarity multiplexer to receive the second error amplification output signal from the error amplifier; the feedback multiplexer selects the second output signal obtained by the common-mode voltage acquisition unit as the feedback voltage; the transistors of the hybrid driving unit are coupled to the current source and disconnected from the ground end.

The present invention provides the following positive effects. The transmitter of the present invention can integrate currently used application interfaces (such as mobile industry processor interface (MIPI), low voltage differential signaling (LVDS) interface, sub-LVDS interface, and HI-SPI interface), not only complying with different specifications and output requirements but also providing several choices of low-voltage and anti-noise transmitters. The transmitter of the present invention not only can support low operating power source, but also support the voltage output mode and the current output mode with common mode control.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the structural and operating principles of the present invention are disclosed below with accompanying drawings.

Figure 1A:
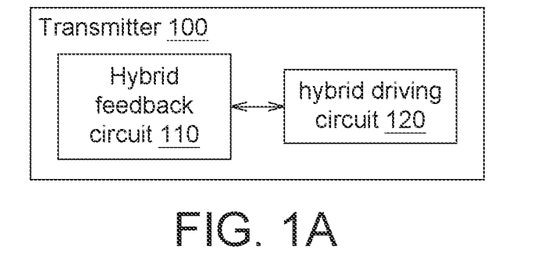
FIG. 1A is a functional block diagram of a transmitter according to an embodiment of the present invention.

FIG. 1A is a functional block diagram of a transmitter according to an embodiment of the present invention. The transmitter 100 includes a hybrid feedback circuit 110 and a hybrid driving circuit 120. The hybrid feedback circuit 110 compares a reference voltage with a feedback voltage in closed-loop, determines whether to perform polarity reversal according to a mode control signal, and controls power output according to a comparison result and the mode control signal. The hybrid feedback circuit 110 further outputs a non-common mode voltage (also referred as "first output signal", which can be a voltage signal, a current signal, or a power signal). The hybrid driving circuit 120, coupled to the hybrid feedback circuit 110, receives the first output signal of the hybrid feedback circuit 110 and generates a transmitter output signal according to an input data, and generates a second output signal according to the transmitter output signal. The first output signal and the second output signal are transmitted back to the hybrid feedback circuit 110. For example, the hybrid driving circuit 120 uses a common mode voltage of the transmitter output signal as a second output signal. The first output signal and the second output signal are transmitted back to the hybrid feedback circuit 110. The feedback voltage is selected from the first output signal (the non-common mode voltage) and the second output signal (the common mode voltage).

Figure 1B:
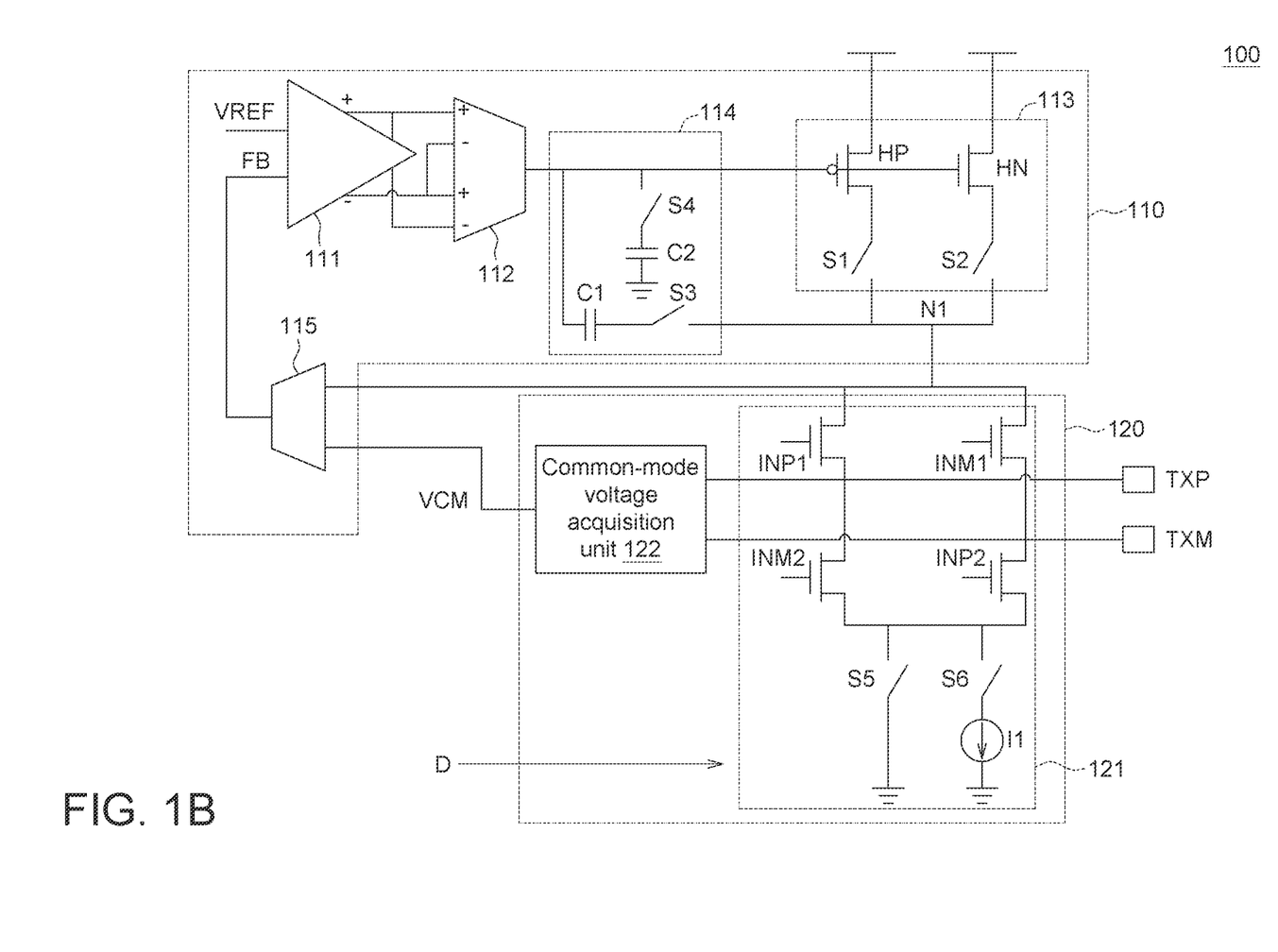
FIG. 1B is a circuit architecture diagram of a transmitter according to an embodiment of the present invention.

Referring to FIG. 1B, a circuit architecture diagram of a transmitter according to an embodiment of the present invention is shown. The transmitter 100 includes the hybrid feedback circuit 110 and the hybrid driving circuit 120.

The hybrid feedback circuit 110 compares the reference voltage VREF with the feedback voltage FB in closed-loop, determines whether to perform polarity reversal according to the mode control signal, and controls the power output according to the comparison result and the mode control signal. The hybrid feedback circuit 110 outputs a non-common mode voltage. Detailed descriptions are disclosed below.

The hybrid driving circuit 120, coupled to the hybrid feedback circuit 110, receives the power output of the hybrid feedback circuit 110 and generates a transmitter output signal (TXP/TXM) according to an input data D. The hybrid driving circuit 120 obtains a common mode voltage of the transmitter output signal VCM, and further transmits back to the hybrid feedback circuit 110.

The feedback voltage FB is selected from the common mode voltage VCM and the non-common mode voltage.

The hybrid feedback circuit 110 includes an error amplifier 111, a polarity multiplexer 112, a hybrid power output unit 113, a hybrid compensation unit 114 and a feedback multiplexer 115. The hybrid driving circuit 120 includes a hybrid driving unit 121 and a common-mode voltage acquisition unit 122.

The error amplifier 111 compares the reference voltage VREF with the feedback voltage FB outputted through the feedback multiplexer 115 to output a differential output signal.

The error amplifier 111 has a first input end, a second input end, a first output end, and a second output end. The first input end is configured to receive the reference voltage VREF. The second input end is configured to receive the feedback voltage FB from the feedback multiplexer 115. The first output end (such as a positive output end) is configured to output a first error amplification output signal (such as a positive output signal) of the differential output signal to the polarity multiplexer 112. The second output end (such as a negative output end) is configured to output a second error amplification output signal (such as a negative output signal) of the differential output signal to the polarity multiplexer 112.

The polarity multiplexer 112, coupled to the error amplifier 111, has a first input end, a second input end, a third input end, a fourth input end, and an output end. The first input end (such as a positive input end) is configured to receive the first error amplification output signal (such as a positive output signal) from the error amplifier 111. The second input end (such as a negative input end) is configured to receive the second error amplification output signal (such as a negative output signal) from the error amplifier 111. The third input end (such as a positive input end) is configured to receive the second error amplification output signal (such as a negative output signal) from the error amplifier 111. The fourth input end (such as a negative input end) is configured to receive the first error amplification output signal (such as positive output signal) from the error amplifier 111. The output end is configured to output a polarity output signal to the hybrid power output unit 113.

The hybrid power output unit 113, coupled to the polarity multiplexer 112, includes a first transistor HP (such as a PMOS transistor), a second transistor HN (such as an NMOS transistor), a first switch S1, and a second switch S2. When outputting power, one of the first transistor HP and the second transistor HN is selected to output power.

The first transistor HP has a source, a gate, and a drain. The source is coupled to the operating power source. The gate is configured to receive the output signal from the polarity multiplexer 112. The drain is selectively coupled to the node N1 through the first switch S1. The node N1 is further coupled to the feedback multiplexer 115. The voltage of the node N1 can be referred as "non-common mode voltage". Or, in other embodiments of the present invention, the voltage of the node N1 can be processed with other operations (including but not limited to voltage division), and the obtained voltage also can be referred as "non-common mode voltage".

The second transistor HN has a source, a gate and a drain. The source is coupled to the operating power source. The gate is configured to receive the output signal of the polarity multiplexer 112. The drain is selectively coupled to the node N1 through the second switch S2.

The first switch S1 is coupled between the drain of the first transistor HP and the node N1.

The second switch S2 is coupled between the drain of the second transistor HN and the node N1.

The hybrid compensation unit 114 is coupled to the hybrid power output unit 113 and the polarity multiplexer 112. The hybrid compensation unit 114 can perform phase compensation. The hybrid compensation unit 114 includes a first capacitor C1, a second capacitor C2, a third switch S3, and a fourth switch S4.

The first capacitor C1 has a first end and a second end. The first end is coupled to the output end of the polarity multiplexer 112. The second end is selectively coupled to the node N1 through the third switch S3.

The second capacitor C2 has a first end and a second end. The first end is coupled to the ground end. The second end is selectively coupled to the output end of the polarity multiplexer 112 through the fourth switch S4. Or, in other embodiments of the present invention, the first end of the second capacitor C2 is coupled to the power source end, and the said arrangement is still within the spirit of the present invention.

The third switch S3 is coupled between the second end of the first capacitor C1 and the node N1.

The fourth switch S4 is coupled between the second end of the second capacitor C2 and the output end of the polarity multiplexer 112.

The feedback multiplexer 115, coupled to the hybrid power output unit 113, has a first input end, a second input end and an output end. The first input end is configured to receive the non-common mode voltage. The second input end is configured to receive the common mode voltage VCM obtained by the common-mode voltage acquisition unit 122. The output end is configured to output the feedback voltage FB. The voltage of the node N1 can be referred as "non-common mode voltage". Or, in other embodiments of the present invention, the voltage of the node N1 can be processed with other operations (including but not limited to voltage division), and the obtained voltage also can be referred as "non-common mode voltage".

In an embodiment of the present invention, when outputting power, one of the first transistor HP and the second transistor HN can be selected to output power. Therefore, the polarity multiplexer 112 can be adapted to the polarity of the transistor (one of the first transistor HP and the second transistor HN) selected by the hybrid power output unit 113, and negative feedback of the closed loop can be maintained.

In an embodiment of the present invention, the hybrid compensation unit 114 can maintain the stability of the closed loop and compensate the transistor (one of the first transistor HP and the second transistor HN) selected by the hybrid power output unit 113. Therefore, the first capacitor C1 and the second capacitor C2, despite having a small capacitance, still can achieve the desired compensation effect.

The hybrid driving unit 121 includes a third transistor INP1, a fourth transistor INP2, a fifth transistor INM1, a sixth transistor INM2, a fifth switch S5, a sixth switch S6 and a current source I1.

The third transistor INP1 has a source, a gate, and a drain. The source is coupled to the node N1. The gate configured to selectively receive the input data D. The drain is coupled to the source of the sixth transistor INM2. The third transistor INP1 is configured to output a first transmitter output signal TXP.

The fourth transistor INP2 has a source, a gate and a drain. The source is coupled to the drain of the fifth transistor INM1. The gate is configured to selectively receive the input data D. The drain is coupled to the fifth switch S5 and the sixth switch S6. The fourth transistor INP2 is configured to output a second transmitter output signal TXM.

The fifth transistor INM1 has a source, a gate and a drain. The source is coupled to the node N1. The gate is configured to selectively receive the input data D. The drain is coupled to the source of the fourth transistor INP2. The fifth transistor INM1 outputs the second transmitter output signal TXM.

The sixth transistor INM2 has a source, a gate a drain. The source is coupled to a drain of the third transistor INP1. The gate is configured to selectively receive the input data D. The drain is coupled to the fifth switch S5 and the sixth switch S6. The sixth transistor INM2 outputs the first transmitter output signal TXP.

One end of the fifth switch S5 is coupled to the drain of the fourth transistor INP2 and the drain of the sixth transistor INM2, and the other end of the fifth switch S5 is grounded.

One end of the sixth switch S6 is coupled to the drain of the fourth transistor INP2 and the drain of the sixth transistor INM2, and the other end of the sixth switch S6 is coupled to the current source I1.

The current source I1 is coupled between the sixth switch S6 and the ground end.

The third transistor INP1, the fourth transistor INP2, the fifth transistor INM1 and the sixth transistor INM2 are selectively coupled to the ground end through the fifth switch S5. The third transistor INP1, the fourth transistor INP2, the fifth transistor INM1 and the sixth transistor INM2 are selectively coupled to the current source I1 through the sixth switch S6.

The common-mode voltage acquisition unit 122 is coupled to the hybrid driving unit 121 for obtaining a common mode voltage VCM from the transmitter output signals TXP and TXM.

Here below, the signals those control the first to the sixth switches S1~S6, the polarity multiplexer 112 and the feedback multiplexer 115 are all referred as "mode control signal".

Figure 2:
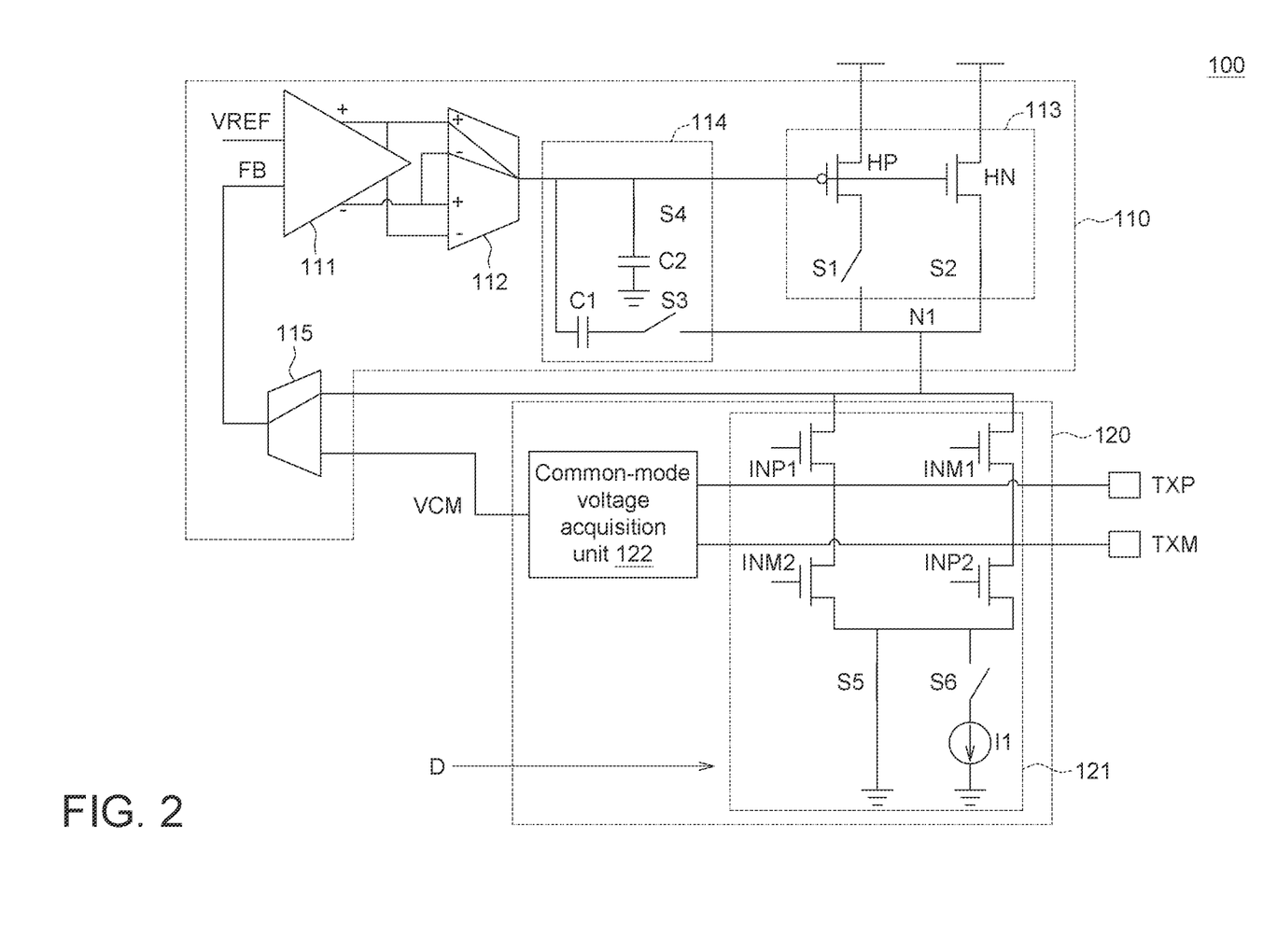
FIGS. 2-5 are schematic operating diagrams of a transmitter in different operating modes according to an embodiment of the present invention.

FIG. 2 is an operating diagram of a transmitter in a voltage output mode in which the NMOS transistor is selected to output power according to an embodiment of the present invention. As indicated in FIG. 2, when the transmitter is in the voltage output mode and an NMOS transistor (that is, the second transistor HN) is selected to output power, the first switch S1 is turned off, the second switch S2 is turned on, the third switch S3 is turned off, the fourth switch S4 is turned on, the fifth switch S5 is turned on, and the sixth switch S6 is turned off. Moreover, the polarity multiplexer 112 selects the first input end (such as a positive input end) to receive the first error amplification output signal (such as a positive output signal) from the error amplifier 111 and selects the second input end (such as a negative input end) to receive the second error amplification output signal (such as a negative output signal) from the error amplifier 111. Furthermore, the feedback multiplexer 115 selects the voltage of the node N1 as the feedback voltage FB.

The error amplifier 111 compares the reference voltage VREF with the feedback voltage FB to generate an output signal. The output signal of the error amplifier 111 is inputted to the gate (the polarity is not reversed) of the second transistor HN the through the polarity multiplexer. Through closed loop, the voltage of the node N1 is substantially identical to the reference voltage VREF. The third transistor INP1, the fourth transistor INP2, the fifth transistor INM1, and the sixth transistor INM2 can selectively receive the input data D. When the input data D is logic high, the voltage of the node N1 can be outputted through the source or drain of the selected transistor (the third transistor INP1 and/or the fourth transistor INP2 and/or the fifth transistor INM1 and/or the sixth transistor INM2) to generate the first transmitter output signal TXP and the second transmitter output signal TXM.

The operating mode of FIG. 2 enables the transmitter 100 to have better anti-noise ability.

Figure 3:
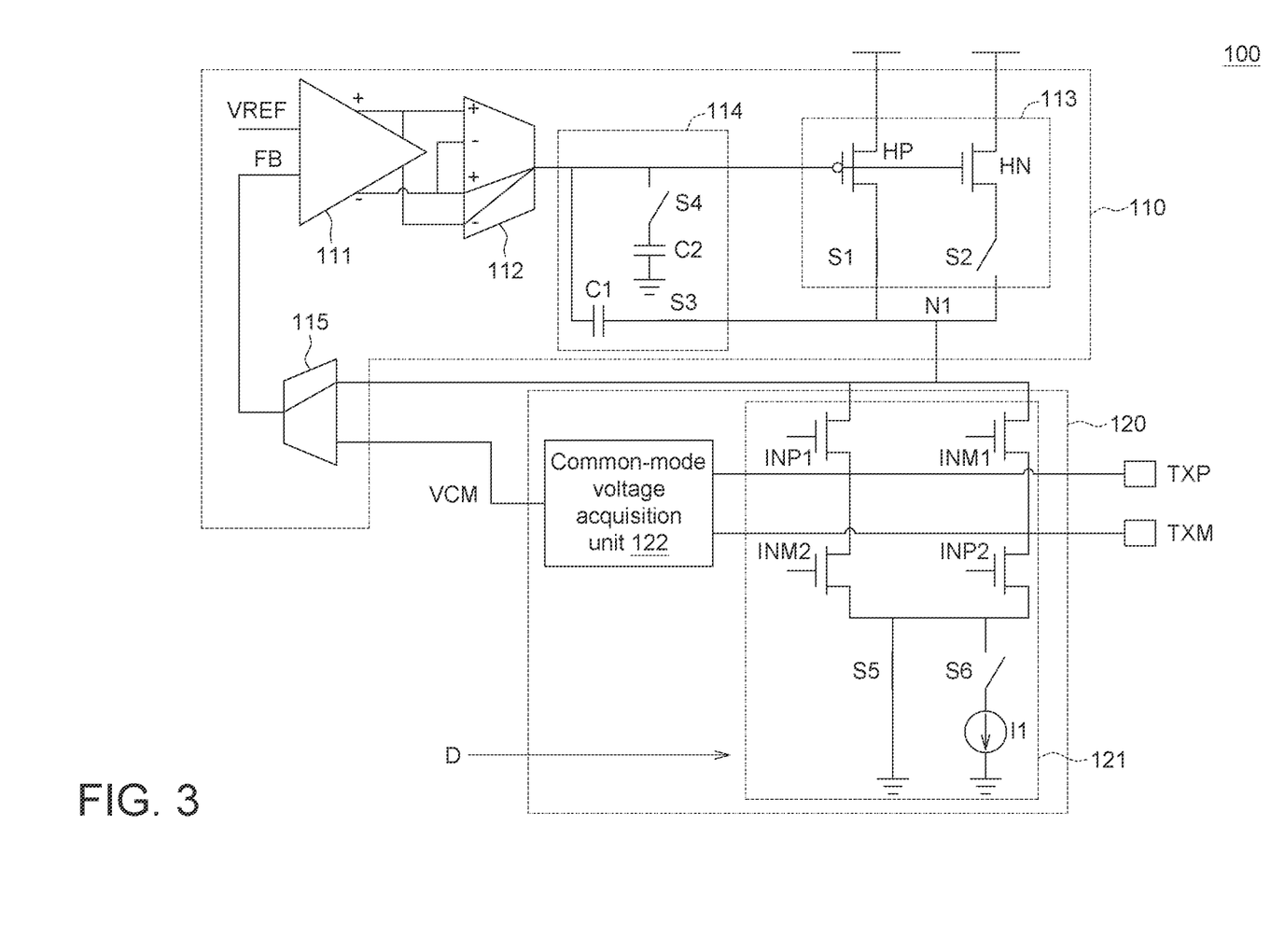

FIG. 3 is an operating diagram of a transmitter in a voltage output mode in which a PMOS transistor is selected to output power according to an embodiment of the present invention. As indicated in FIG. 3, when the transmitter is in the voltage output mode and a PMOS transistor (that is, the first transistor HP) is selected to output power, the first switch S1 is turned on, the second switch S2 is turned off, the third switch S3 is turned on, the fourth switch S4 is turned off, the fifth switch S5 is turned on, and the sixth switch S6 is turned off. Moreover, the polarity multiplexer 112 selects the fourth input end (such as a negative input end) to receive the first error amplification output signal (such as a positive output signal) from the error amplifier 111 and selects the third input end (such as a positive input end) to receive the second error amplification output signal (such as a negative output signal) from the error amplifier 111. Furthermore, the feedback multiplexer 115 selects the voltage of the node N1 as the feedback voltage FB.

The error amplifier 111 compares the reference voltage VREF with the feedback voltage FB to generate an output signal. The output signal of the error amplifier 111 is inputted to the gate (the polarity is reversed) of the first transistor HP through the polarity multiplexer. Through closed loop, the voltage of the node N1 is substantially identical to the reference voltage VREF. The third transistor INP1, the fourth transistor INP2, the fifth transistor INM1, and the sixth transistor INM2 can selectively receive the input data D. When the input data D is logic high, the voltage of the node N1 can be outputted through the source or the drain of the selected transistor (the third transistor INP1 and/or the fourth transistor INP2 and/or the fifth transistor INM1 and/or the sixth transistor INM2) to generate the first transmitter output signal TXP and the second transmitter output signal TXM.

The operating mode of FIG. 3 enables the transmitter 100 to operate with low operation voltage for reducing power consumption.

Figure 4:
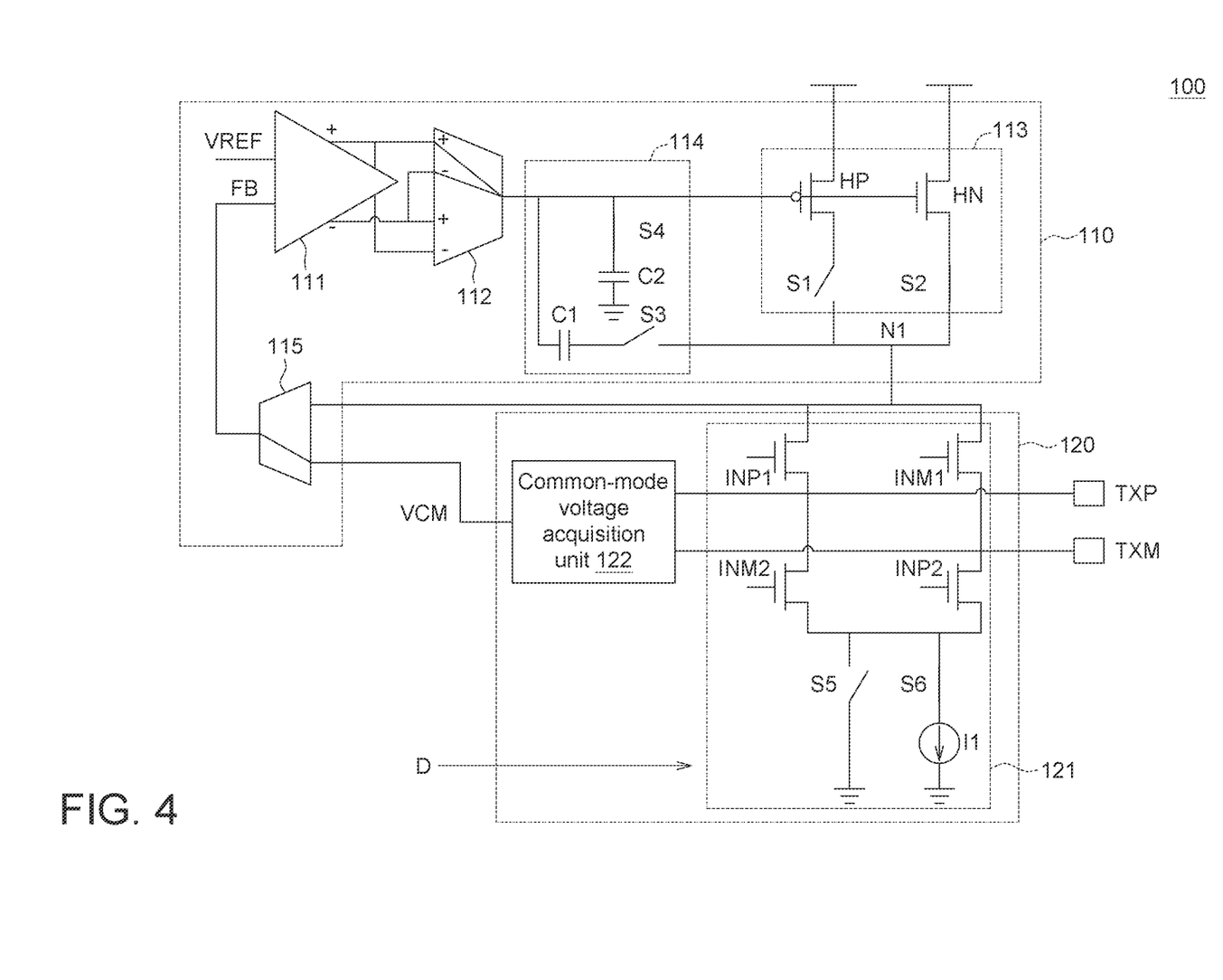

FIG. 4 is an operating diagram of a transmitter in a current output mode in which an NMOS transistor is selected to output power according to an embodiment of the present invention. As indicated in FIG. 4, when the transmitter is in the current output mode and an NMOS transistor (that is, the second transistor HN) is selected to output power, the first switch S1 is turned off, the second switch S2 is turned on, the third switch S3 is turned off, the fourth switch S4 is turned on, the fifth switch S5 is turned off, and the sixth switch S6 is turned on. Moreover, the polarity multiplexer 112 selects the first input end (such as a positive input end) to receive the first error amplification output signal (such as a positive output signal) from the error amplifier 111 and selects the second input end (such as a negative input end) to receive the second error amplification output signal (such as a negative output signal) from the error amplifier 111. Furthermore, the feedback multiplexer 115 selects the common mode voltage VCM obtained by the common-mode voltage acquisition unit 122 as the feedback voltage FB.

The error amplifier 111 compares the reference voltage VREF with the feedback voltage FB to generate an output signal. The output signal of the error amplifier 111 is inputted to the gate (the polarity is not reversed) of the second transistor HN through the polarity multiplexer. The third transistor INP1, the fourth transistor INP2, the fifth transistor INM1, and the sixth transistor INM2 can selectively receive the input data D. When the input data D is logic high, the voltage of the node N1 can be outputted through the source or drain of the selected transistor (the third transistor INP1 and/or the fourth transistor INP2 and/or the fifth transistor INM1 and/or the sixth transistor INM2) to generate the first transmitter output signal TXP and the second transmitter output signal TXM.

The operating mode of FIG. 4 enables the transmitter 100 to have better anti-noise ability.

Figure 5:
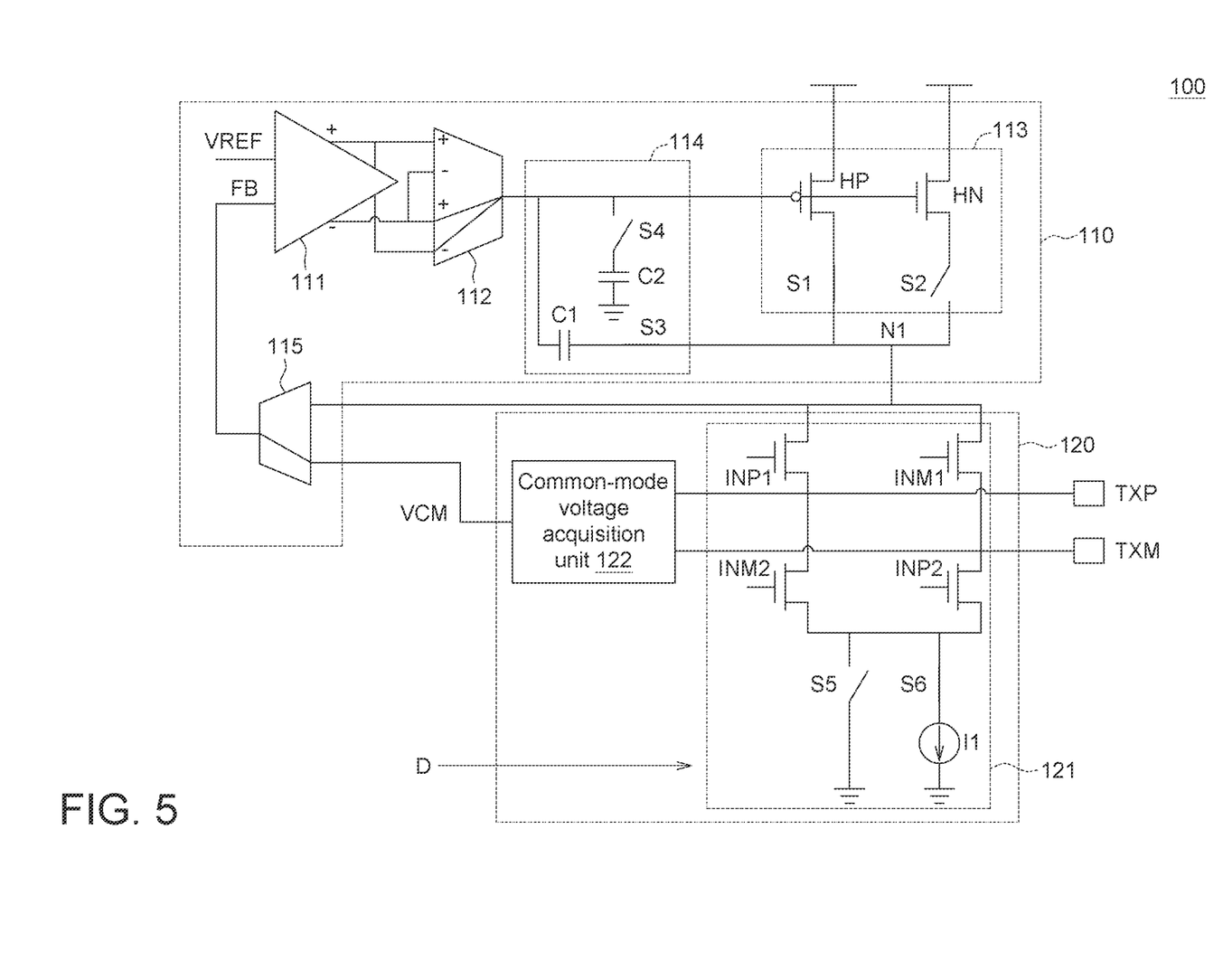

FIG. 5 is an operating diagram of a transmitter in a current output mode in which a PMOS transistor is selected to output power according to an embodiment of the present invention. As indicated in FIG. 5, when the transmitter is in the current output mode and a PMOS transistor (that is, the first transistor HP) is selected to output power, the first switch S1 is turned on, the second switch S2 is turned off, the third switch S3 is turned on, the fourth switch S4 is turned off, the fifth switch S5 is turned off, and the sixth switch S6 is turned on. Moreover, the polarity multiplexer 112 selects the fourth input end (such as negative input end) to receive the first error amplification output signal (such as positive output signal) from the error amplifier 111 and selects the third input end (such as positive input end) to receive the second error amplification output signal (such as negative output signal) from the error amplifier 111. Furthermore, the feedback multiplexer 115 selects the common mode voltage VCM obtained by the common-mode voltage acquisition unit 122 as the feedback voltage FB.

The error amplifier 111 compares the reference voltage VREF with the feedback voltage FB to generate an output signal. The output signal of the error amplifier 111 is inputted to the gate (the polarity is reversed) of the first transistor HP through the polarity multiplexer. The third transistor INP1, the fourth transistor INP2, the fifth transistor INM1, and the sixth transistor INM2 can selectively receive the input data D. When the input data D is logic high, the voltage of the node N1 can be outputted through the source/the drain of the selected transistor (the third transistor INP1 and/or the fourth transistor INP2 and/or the fifth transistor INM1 and/or the sixth transistor INM2) to generate the first transmitter output signal TXP and the second transmitter output signal TXM.

The operating mode of FIG. 5 enables the transmitter 100 to operate with low operation voltage for reducing power consumption.

Details of selecting the third transistor INP1 to the sixth transistor INM2 to generate the transmitter output signals TXP and TXM are disclosed below.

In the specification of the present invention, the designations TXP and TXM can at the same time represent output ends and output signals. In the present invention an embodiment, a terminal resistor (such as 100 Ohm) is coupled between the output end TXP and TXM, such that the third transistor INP1 and the fourth transistor INP2 can be turned on, and the flowing direction of the current can be: the third transistor INP1, the output end TXP, the output end TXM, and the fourth transistor INP2. Thus, the transmitter output signal TXP with a positive potential can be obtained at the output end TXP, the transmitter output signal TXM with a negative potential can be obtained at the output end TXM, and the transmitter output signal TXP and the transmitter output signal TXM form a differential signal.

Or, in another embodiment of the present invention, a terminal resistor (such as 100 Ohm) is coupled between the output end TXP and TXM, such that the fifth transistor INM1 and the sixth transistor INM2 can be turned on, and the flowing direction of the current can be: the fifth transistor INM1, the output end TXM, the output end TXP, the sixth transistor INM2. Thus, the transmitter output signal TXP with a negative potential can be obtained at the output end TXP, the transmitter output signal TXM with a positive potential can be obtained at the output end TXM, and the transmitter output signal TXP and the transmitter output signal TXM form a differential signal.

Or, in another embodiment of the present invention, a terminal resistor (such as 100 Ohm) is coupled between the output ends TXP and TXM, such that the third transistor INP1 and the fifth transistor INM1 can be turned on or turned off synchronously (or the fourth transistor INP2 and the sixth transistor INM2 can be turned on or turned off synchronously), such that transmitter output signal TXP and the transmitter output signal TXM can be outputted through the output end TXP and the output end TXM respectively, wherein the transmitter output signal TXP and the transmitter output signal TXM are common mode signals.

Or, in another possible embodiment of the present invention, a terminal resistor (such as 50 Ohm) is coupled between the output end TXP and the ground end, and another terminal resistor (such as 50 Ohm) is coupled between the output end TXM and the ground end, such that the third transistor INP1 and the fifth transistor INM1 can be alternately turned on (meanwhile, the fourth transistor INP2 and the sixth transistor INM2 are turned off). Thus, the transmitter output signal TXP can be obtained at the output end TXP, the transmitter output signal TXM can be obtained at the output end TXM, and the transmitter output signal TXP and the transmitter output signal TXM form a differential signal.

Or, in another possible embodiment of the present invention, a terminal resistor (such as 50 Ohm) is coupled between the output end TXP and the operating power source, and another terminal resistor (such as 50 Ohm) is coupled between the output end TXM and the operating power source, such that the fourth transistor INP2 and the sixth transistor INM2 can be alternately turned on (meanwhile, the third transistor INP1 and the fifth transistor INM1 are turned off). Thus, the transmitter output signal TXP can be obtained at the output end TXP, the transmitter output signal TXM can be obtained at the output end TXM, and the transmitter output signal TXP and the transmitter output signal TXM form a differential signal.

Or, in another possible embodiment of the present invention, a terminal resistor (such as 50 Ohm) is coupled between the output end TXP and the ground end, and another terminal resistor (such as 50 Ohm) is coupled between the output end TXM and the ground end, such that the third transistor INP1 and the fifth transistor INM1 can be turned on and turned off synchronously (meanwhile, the fourth transistor INP2 and the sixth transistor INM2 are turned off). Thus, the transmitter output signal TXP can be obtained at the output end TXP, the transmitter output signal TXM can be obtained at the output end TXM, and the transmitter output signal TXP and the transmitter output signal TXM form a common mode signal.

Or, in another possible embodiment of the present invention, a terminal resistor (such as 50 Ohm) is coupled between the output end TXP and the operating power source, and another terminal resistor (such as 50 Ohm) is coupled between the output end TXM and the operating power source, such that the fourth transistor INP2 and the sixth transistor INM2 can be turned on and turned off synchronously (meanwhile, the third transistor INP1 and the fifth transistor INM1 are turned off). Thus, the transmitter output signal TXP can be obtained at the output end TXP, the transmitter output signal TXM can be obtained at the output end TXM, and the transmitter output signal TXP and the transmitter output signal TXM form a common mode signal.

To summarize, the transmitter disclosed in above embodiments of the present invention can integrate currently used application interfaces (such as mobile industry processor interface (MIPI), low voltage differential signaling (LVDS) interface, sub-LVDS interface, and HI-SPI interface), not only complying with different specifications and output requirements but also providing several choices of low-voltage and anti-noise transmitters. The transmitter disclosed in above embodiments of the present invention not only can support low operating power source, but also support the voltage output mode and the current output mode with common mode control.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transmitter comprising:
   a hybrid feedback circuit for comparing a reference voltage with a feedback voltage in closed-loop, determining whether to perform polarity reversal according to a mode control signal, controlling power output according to a comparison result and the mode control signal, and generating a first output signal; and
   a hybrid driving circuit coupled to the hybrid feedback circuit, the hybrid driving circuit receiving the first output signal of the hybrid feedback circuit, generating a transmitter output signal according to an input data, and generating a second output signal according to the transmitter output signal, wherein the first output signal and the second output signal are transmitted back to the hybrid feedback circuit.

2. The transmitter according to claim 1, wherein the hybrid feedback circuit comprises:
   an error amplifier having a first input end for receiving the reference voltage; a second input end for receiving the feedback voltage; a first output end for outputting a first error amplification output signal; and a second output end for outputting a second error amplification output signal;
   a polarity multiplexer coupled to the error amplifier, having a first input end for receiving the first error amplification output signal from the error amplifier; a second input end for receiving the second error amplification output signal from the error amplifier; a third input end for receiving the second error amplification output signal from the error amplifier; a fourth input end for receiving the first error amplification output signal from the error amplifier; and an output end for outputting a polarity output signal;

a hybrid power output unit coupled to the polarity multiplexer, comprising a first transistor and a second transistor, wherein one of the first transistor and the second transistor is selected to perform power output, and a feedback multiplexer coupled to the hybrid power output unit, having a first input end coupled to a feedback node for receiving the first output signal, a second input end for receiving the second output signal, and an output end for outputting the feedback voltage.

3. The transmitter according to claim 2, wherein the hybrid feedback circuit further comprises: a hybrid compensation unit coupled to the hybrid power output unit for compensating the hybrid power output unit.

4. The transmitter according to claim 3, wherein the hybrid driving circuit comprises:

a hybrid driving unit comprising a current source and a plurality of transistors, wherein the transistors are selectively coupled to a ground end and selectively coupled to the current source for generating the transmitter output signal; and a common-mode voltage acquisition unit coupled to the hybrid driving unit for obtaining the second output signal from the transmitter output signal.

5. The transmitter according to claim 4, wherein when the transmitter is in a voltage output mode and the second transistor is selected to output power, the polarity multiplexer selects the first input end of the polarity multiplexer to receive the first error output signal from the error amplifier and selects the second input end of the polarity multiplexer to receive the second error amplification output signal from the error amplifier; the feedback multiplexer selects the first output signal as the feedback voltage; the transistors of the hybrid driving unit are coupled to the ground end and disconnected from the current source.

6. The transmitter according to claim 4, wherein when the transmitter is in a voltage output mode and the first transistor is selected to output power, the polarity multiplexer selects the fourth input end of the polarity multiplexer to receive the first error amplification output signal from the error amplifier, selects the third input end of the polarity multiplexer to receive the second error amplification output signal from the error amplifier, and selects the first output signal as the feedback voltage; the transistors of the hybrid driving unit are coupled to the ground end and disconnected from the current source.

7. The transmitter according to claim 4, wherein when the transmitter is in a current output mode and the second transistor is selected to output power, the polarity multiplexer selects the first input end of the polarity multiplexer to receive the first error amplification output signal from the error amplifier and selects the second input end of the polarity multiplexer to receive the second error amplification output signal from the error amplifier; the feedback multiplexer selects the second output signal obtained by the common-mode voltage acquisition unit as the feedback voltage; the transistors of the hybrid driving unit are coupled to the current source and disconnected from the ground end.

8. The transmitter according to claim 4, wherein when the transmitter is in a current output mode and the first transistor is selected to output power, the polarity multiplexer selects the fourth input end of the polarity multiplexer to receive the first error amplification output signal from the error amplifier and selects the third input end of the polarity multiplexer to receive the second error amplification output signal from the error amplifier; the feedback multiplexer selects the second output signal obtained by the common-mode voltage acquisition unit as the feedback voltage; the transistors of the hybrid driving unit are coupled to the current source and disconnected from the ground end.

* * * * *